(12) United States Patent  (10) Patent No.: US 6,642,740 B2
Kim et al.  (45) Date of Patent: Nov. 4, 2003

(54) PROGRAMMABLE TERMINATION CIRCUIT AND METHOD

(75) Inventors: Nam-Seog Kim, Seoul (KR); Uk-Rae Cho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 09/933,102

(22) Filed: Aug. 20, 2001

(65) Prior Publication Data

US 2002/0053923 A1 May 9, 2002

(30) Foreign Application Priority Data

Sep. 15, 2000 (KR) ........................ 2000-54161

(51) Int. Cl.[7] .................. H03K 19/003; H03K 19/0175
(52) U.S. Cl. ........................... 326/30; 326/83
(58) Field of Search ................. 326/30, 86, 87, 326/82, 83, 59–60

(56) References Cited

U.S. PATENT DOCUMENTS

| 5,602,494 | A | * | 2/1997 | Sundstrom | 326/30 |
|---|---|---|---|---|---|
| 5,705,937 | A | * | 1/1998 | Yap | 326/30 |
| 6,049,221 | A | * | 4/2000 | Ishibashi et al. | 326/30 |
| 6,087,847 | A | * | 7/2000 | Mooney et al. | 326/30 |
| 6,424,175 | B1 | * | 7/2002 | Vangal et al. | 326/82 |

* cited by examiner

*Primary Examiner*—Michael Tokar
*Assistant Examiner*—James H. Cho
(74) *Attorney, Agent, or Firm*—F. Chau & Associates, LLP

(57) ABSTRACT

A semiconductor device is provided which includes: a plurality of termination circuits having a plurality of impedance elements connected to an input/output pad, said termination circuits being controlled by impedance control signals; and a controller for outputting said impedance control signals to adaptively change with changes in characteristic impedance of a transmission line connected to the input/output pad in bi-directional data communication, to adaptively control the plurality of impedance elements in the plurality of input termination circuits for matching the impedance to the characteristic impedance of the transmission line. Each of the plurality of impedance elements is configured in pairs of MOS transistors. The plurality of termination circuits have different impedance values. And each of the impedance elements of the plurality of termination circuits is independently controlled.

10 Claims, 8 Drawing Sheets

PROGRAMMABLE TERMINATION CIRCUIT AND METHOD

BACKGROUND OF THE INVENTION

1. Field of the Invention

The present invention relates to a semiconductor device and more particularly to a programmable data output circuit with programmable on-chip termination operations.

2. Description of the Related Art

When data is transmitted through a signal line at a data rate of over 100 bps, the larger capacitive value at output and input terminals, the more the capacitance affects the data transmitted. If the capacitance at the output terminal is large, the output driver has a low slew rate, reducing operational speed or cause erroneous data transmission. For example, if the capacitance is very large, a digital transmission signal does not fully swing and the complete signal is not received in a receiver. To solve these problems, it is most effective to reduce the capacitance as greatly as possible. However, data transmitters and receivers in an integrated circuit chip are all circuit elements directly connected with components external to the chip. To effectively drive the signals, the transmitters should have a large driving capacity, but, it is difficult to reduce the capacitance value without limit in considering protection against electro static discharge (ESD).

Generally, when signals are transferred among integrated circuits, the signal paths form transmission lines. If there is a mismatch between the transmitter, transmission line, or the receiver, the transmitted signal is reflected.

The transmission lines are therefore typically terminated with a termination device, such as a resistor with a resistance value substantially identical to a characteristic impedance of the transmission line. That is, to minimize signal reflections, ringing, overshoot and undershoot at the receiver. It is also preferable that output impedance of an output driver is matched to characteristic impedance of the transmission line as closely as possible.

If a resistor is installed for on-chip termination, the resistor dissipates power in the circuit, generates undesirable heat, and consumes power continuously even if the receiver does not receive data. Furthermore, the resistor is placed inside a chip and its value cannot be changed; therefore, it cannot adaptively carry out termination at other characteristic impedance of the transmission line.

U.S. Pat. No. 5,731,711 by Gabara, titled "INTEGRATED CIRCUIT CHIP WITH ADAPTIVE INPUT-OUTPUT PORT" proposes to reduce power dissipation of a chip through an adaptive on-chip termination. A controllable impedance arrangement provides different characteristic impedances through a transmission line depending on transmission and reception characteristics of data signals.

FIG. 1 is a conventional integrated circuit having adaptive input/output ports for bidirectional communication. Adaptive input/output ports 100 and 150 are disposed in the integrated circuits 101 and 151, respectively. Each adaptive input/output ports 100 and 150 includes an input buffer 105 and a controllable impedance arrangement 110 connected to a transmission line 115 through a pad 11 and an interface 103. Each controllable impedance arrangement 110 includes three switchable impedance elements 120, 125 and 130. The impedance elements 120, 125 and 130 should be switchable to provide a respective impedance value or an open circuit between respective power supply (not shown in FIG. 1) and interface 103.

In operation, each input/output port 100 or 150 can be configured to receive a communication signal from the other port by activating the impedance element 120 while deactivating the impedance elements 125 and 130. Further, each input/output port 100 or 150 can be configured to transmit a communication signal at a first signal level by activating impedance element 125 while deactivating the impedance elements 120 and 130. Likewise, each input/output port 100 or 150 can be configured to transmit a communication signal at a second signal level by activating impedance element 130 while deactivating the impedance elements 120 and 125.

However, even if different impedance values are provided respectively depending on transmission or reception to perform an adaptive on-chip termination, only one impedance may be fixedly provided, thereby rapid coordination with changing characteristic impedance values of the transmission line is difficult. In other words, for on-chip termination in reception of a data signal, the impedance element 120 is activated while deactivating the other impedance elements 125 and 130, thereby fixing the termination impedance at one value, output driver is fixed at one value for each case in performing a source termination.

Therefore, if the characteristic impedance ZO of the transmission line 115 often changes during transmitting or receiving data, it becomes difficult to match properly impedance values. Thus, a need exists for a controllable impedance circuit of an integrated circuit for effectively solving the aforementioned problems.

SUMMARY OF THE INVENTION

A semiconductor device is provided which includes: a plurality of termination circuits having a plurality of impedance elements connected to an input/output pad, said termination circuits being controlled by impedance control signals; and a controller for outputting said impedance control signals to adaptively change with changes in characteristic impedance of a transmission line connected to the input/output pad in bidirectional data communication, to adaptively control the plurality of impedance elements in the plurality of input termination circuits for matching the impedance to the characteristic impedance of the transmission line.

According to an aspect of the present invention, each of the plurality of impedance elements is configured in pairs of MOS transistors. The plurality of termination circuits have different impedance values. And each of the impedance elements of the plurality of termination circuits is independently controlled.

According to an aspect of the present invention, the controller includes: a programmable impedance controller to detect an external resistance value and to generate upper and lower driver codes as digital codes; a multiplexer to multiplex the digital codes as multiplexing outputs; and a plurality of control signal generating parts to receive the multiplexing outputs and a mode signal shifted according to transmission mode or reception mode and to generate the control signals for controlling the plurality of impedance elements. The multiplexer includes: a first group of NAND gates to generate a NAND response by receiving corresponding codes from the upper driver codes and commonly receiving the upper data output; a second group of NAND gates to generate a NAND response by receiving corresponding codes from the lower driver codes and commonly receiving the lower data outputs; a first group of inverters connected to corresponding outputs of the first group of NAND gates; and a second group of inverters connected to corresponding outputs of the second group of NAND gates. The control signal generating part comprises a plurality of inverters, NOR gates, and NAND gates to generate the control signals to control the plurality of impedance elements by receiving a mode signal shifted according to a transmission or reception mode and one of the multiplexing outputs of the multiplexer.

A method for operating the data output circuit of a semiconductor device having a plurality of impedance elements connected to an input/output pad for bi-directional data transmission through a transmission line is provided which includes the steps of: providing a variable program code signal to the plurality of impedance elements, when the semiconductor device is in data output mode, to enable the data output to perform adaptively output driving operations with transmission impedance of the plurality of impedance elements being matched to characteristic impedance of the transmission line connected to the input/output pad; and providing a variable program code signal to the plurality of impedance elements, when the semiconductor device is in data reception mode, to enable the data input from outside through the input/output pad to be shifted to an input buffer connected with the data output circuit with transmission impedance of the plurality of impedance elements being matched to characteristic impedance of the transmission line connected to the input/output pad.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF PREFERRED EMBODIMENTS

Figure 1:
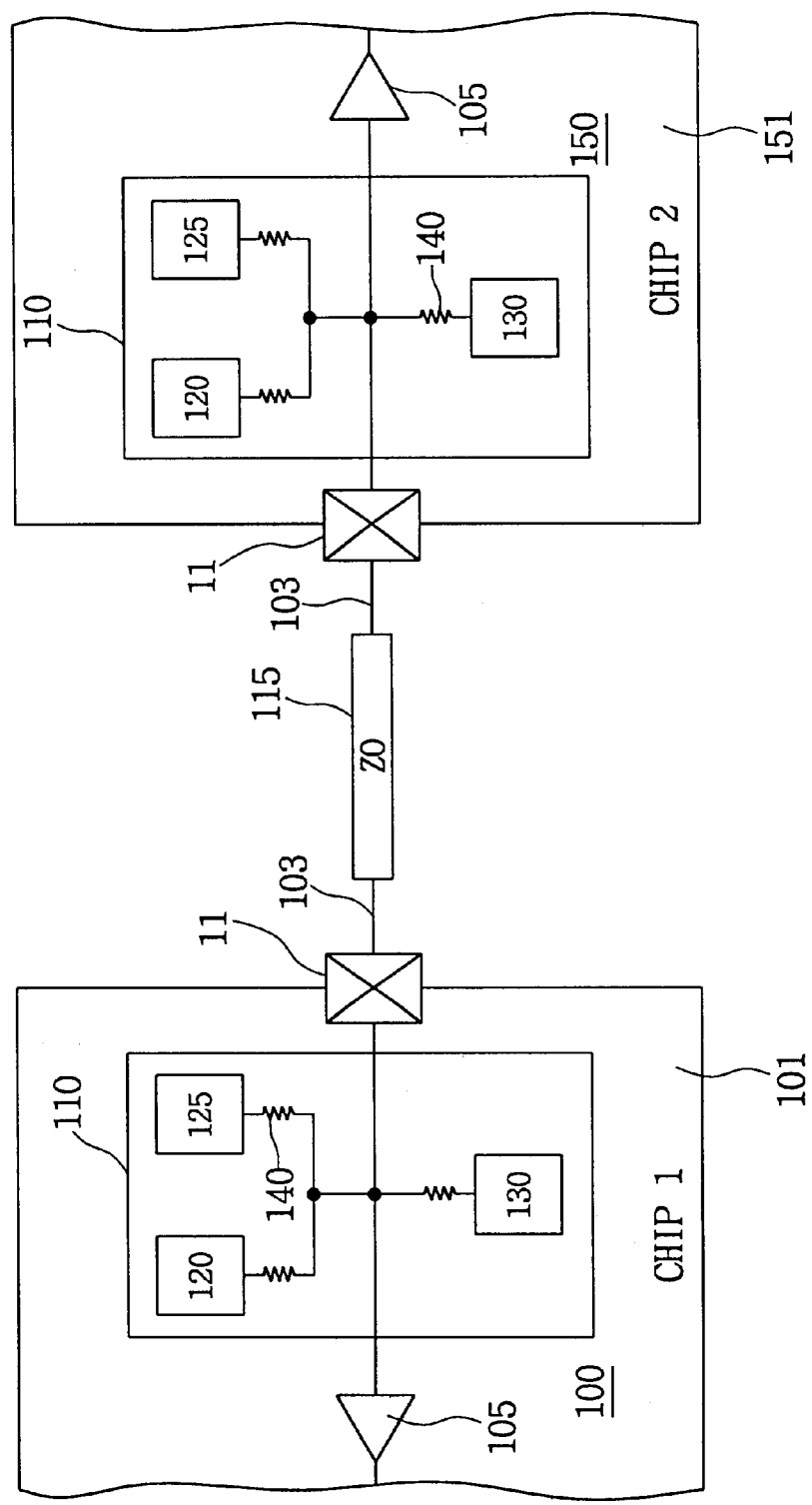
FIG. 1 is a conventional integrated circuit having bidirectional adaptive input/output ports.

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to on skilled in the art that the present invention can be achieved without the specifications. There will be omission of detailed description about well known functions and structures to clarify key points of the present invention.

Figure 2:
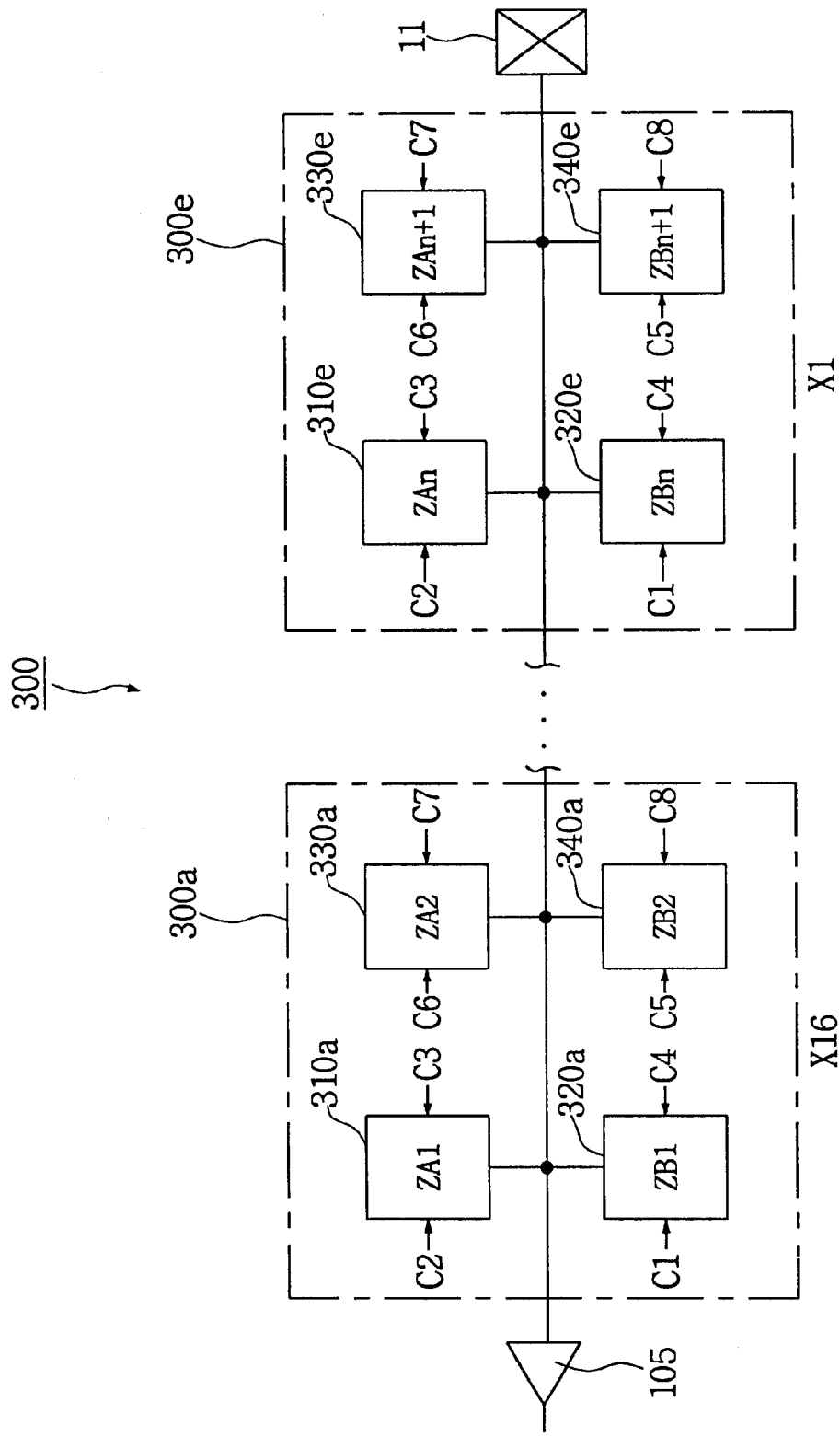
FIG. 2 is an arrangement of impedance elements configuring a plurality of input termination circuit cum output drivers according to a preferred embodiment of the present invention.

FIG. 2 is an arrangement of impedance elements configuring a plurality of input termination circuit cum output drivers in a data output circuit according to a preferred embodiment of the present invention. Referring to FIG. 2, the data output circuit 300 includes a plurality of input termination circuit cum output drivers 300a–300e. Each input termination circuit cum output drivers 300a–300e has a plurality of impedance elements (310–340)a, (310–340)b, (310–340)c, (310–340)d, and (310–340)e, respectively.

Each of the impedance elements 310a–310e is connected to an input/output pad 11 in parallel, so that they are turned on or off in response to corresponding impedance control signals C1–C8. Likewise, each of the impedance elements 320a–320e, 330a–330e, and 340a–340e is connected to the input/output pad 11 in parallel. They are turned on or off in response to corresponding impedance control signals C1–C8.

According to a preferred embodiment, the plurality of input termination circuit cum output drivers 300a–300e perform a source termination in data transmission as an output driver and function as an input termination circuit in data reception. They do not change capacitance in comparison with that of a general case that an output driver and an input termination circuit are separately configured in parallel on the pad 11. In other words, the plurality of input termination circuit cum output drivers 300a–300e have a function of a termination circuit, so that the capacitance of the input/output pad is not different from the capacitance value of the pad having the only output circuit.

If an output driver and an input termination circuit are connected in parallel as in a conventional system, the output driver and the input termination circuit should have an effective resistance value (RO) as same as a characteristic impedance (ZO) of transmission line for a source termination, i.e., RO=ZO, thereby increasing the capacitance value by approximately 50% at each pad. However, according to an embodiment of the present invention in FIG. 2, the plurality of input termination circuit cum output drivers perform input termination, so that an increase of the capacitance is prevented. Digital control signals C1–C8 are programmably set depending on changes in characteristic impedance of a transmission line connected to the pad in bi-directional data communication. The control signals selectively control the termination circuits to adaptively match impedances.

Figure 3:
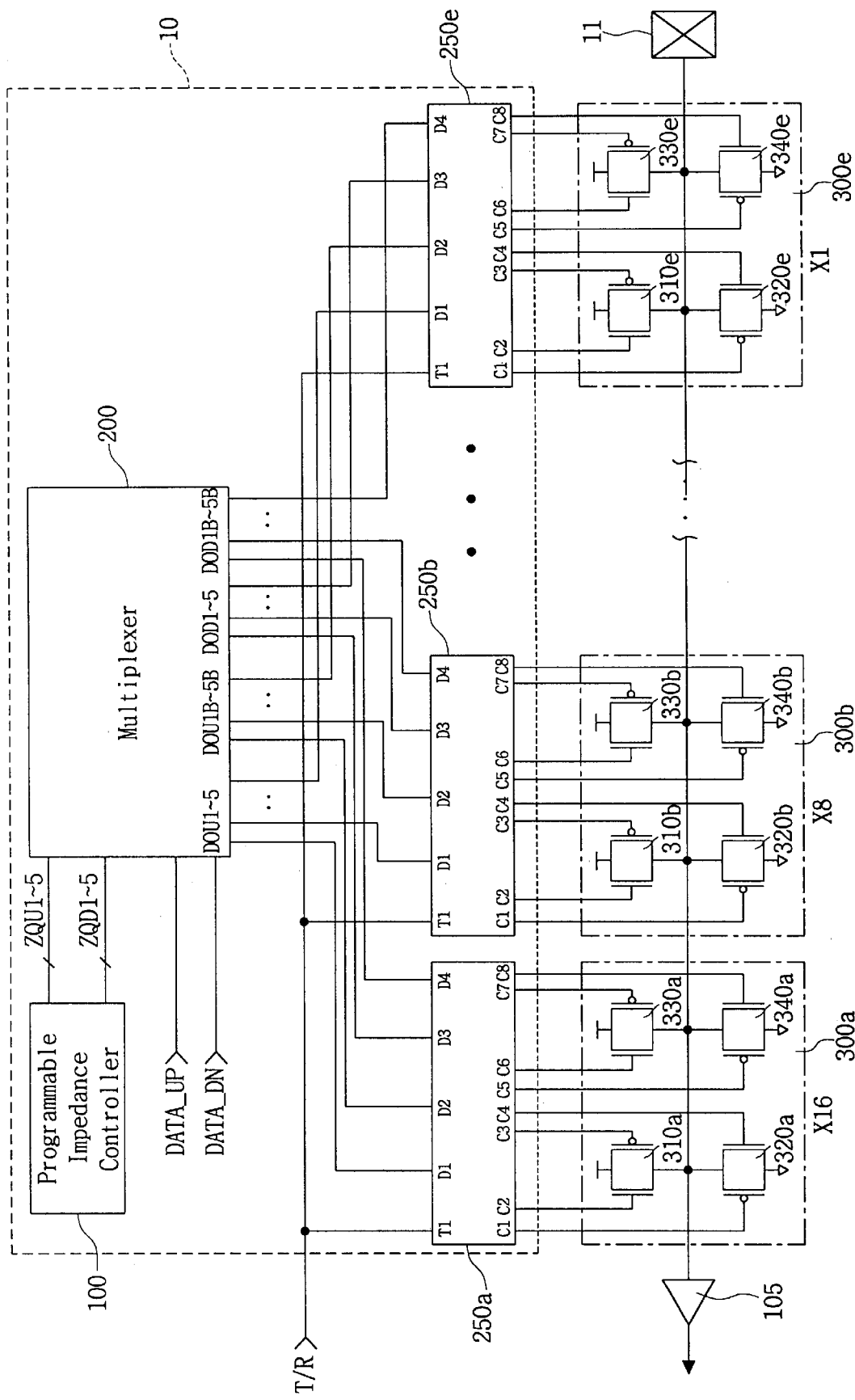
FIG. 3 is a schematic diagram for illustrating a programmable impedance controller to programmably control the data output circuit shown in FIG. 2.

FIG. 3 is a schematic diagram for illustrating a programmable impedance controller for programmably controlling the data output circuit 300 of FIG. 2. Referring to FIG. 3, a control unit 10 includes a programmable impedance controller 100 which is commonly known as ZQ controller and a multiplexer 200 having a plurality of control signal generating parts 250a–250e. The control unit 10 can be configured on a substrate such as a printed circuit board (PCB) or a multi-chip module. The control unit 10 detects a change in characteristic impedance of the transmission line connected to the input/output pad 11 during bi-directional data communication and programmably sets a digital coding signal according to the detected change of characteristic impedance. Then, the set digital coding signal is shifted as a control signal into the impedance elements (310–340)a, (310–340)b, (310–340)c, (310–340)d, and (310–340)e of the output drivers 300a–300e. Accordingly, the impedance elements (310–340)a, (310–340)b, (310–340)c, (310–340)d, and (310–340)e are selectively turned on or off to match adaptively an impedance with the characteristic impedance for the transmission line.

When a resistor is connected to an external part of an integrated circuit chip, the controller 100 programmably sets impedance which is substantially identical to the resistance of the resistor for matching impedances. For instance, if an impedance of the transmission line is 50 ohms, a resistor of 50 ohms is connected to a specific pin of the chip to match an impedance of the output circuit. Then, the programmable impedance controller 100 detects the resistance and generates upper driver codes ZQU1–ZQU5 and lower driver codes ZQD1–ZQD5 corresponding to 50 ohms as digital codes.

According to an embodiment of the present invention, the controlling function of the programmable impedance controller 100 or the structure of the data output drivers 300a–300e is preferably designed such that the impedance of the data output circuit 300 has twice or four times as great as the resistance applied at the external part of the chip. For instance, if the impedance of the data output circuit 300 is desired at 100 ohms when a resistor is 50 ohms in the chip, a size of the elements of the plurality of input termination circuit cum output drivers 300a–300e formed at the end of the circuit should be adjusted. As a result, the programmable impedance controller 100 detects an external impedance, and generates a digital code for adjustment of an internal impedance. In this case, the programmable impedance controller 100 adaptively matches the internal impedance with the external impedance by actively renewing digital codes at a predetermined period of time according to a change in operation, voltage or temperature of a chip.

The programmable impedance controller 100 is preferably configured with elements and functions similar to those described in commonly assigned Korean patent No. 1999-37795, filed on Sep. 7, 1999 and corresponding U.S. application Ser. No. 09/656,975, filed on Sep. 7, 2000, entitled "PROGRAMMABLE IMPEDANCE CONTROL OUTPUT CIRCUIT AND PROGAMMABLE IMPEDANCE CONTROL METHOD THEREOF IN SEMICONDUCTOR SEVICE". The descriptions in the aforementioned patent and patent application are incorporated-by-reference herein.

The multiplexer 200 of the control unit 10 multiplexes the upper driver codes ZQU1–ZQU5 and lower driver codes ZQD1–ZQD5 generated in the programmable impedance controller 100, and data outputs DATA_UP, DATA_DN to generate multiplexing outputs DOU1–5, DOU1B–5B, DOD1B–5B. The detailed structure of the multiplexer 200 and its multiplexing operations will be described with reference to FIG. 4.

Figure 4:
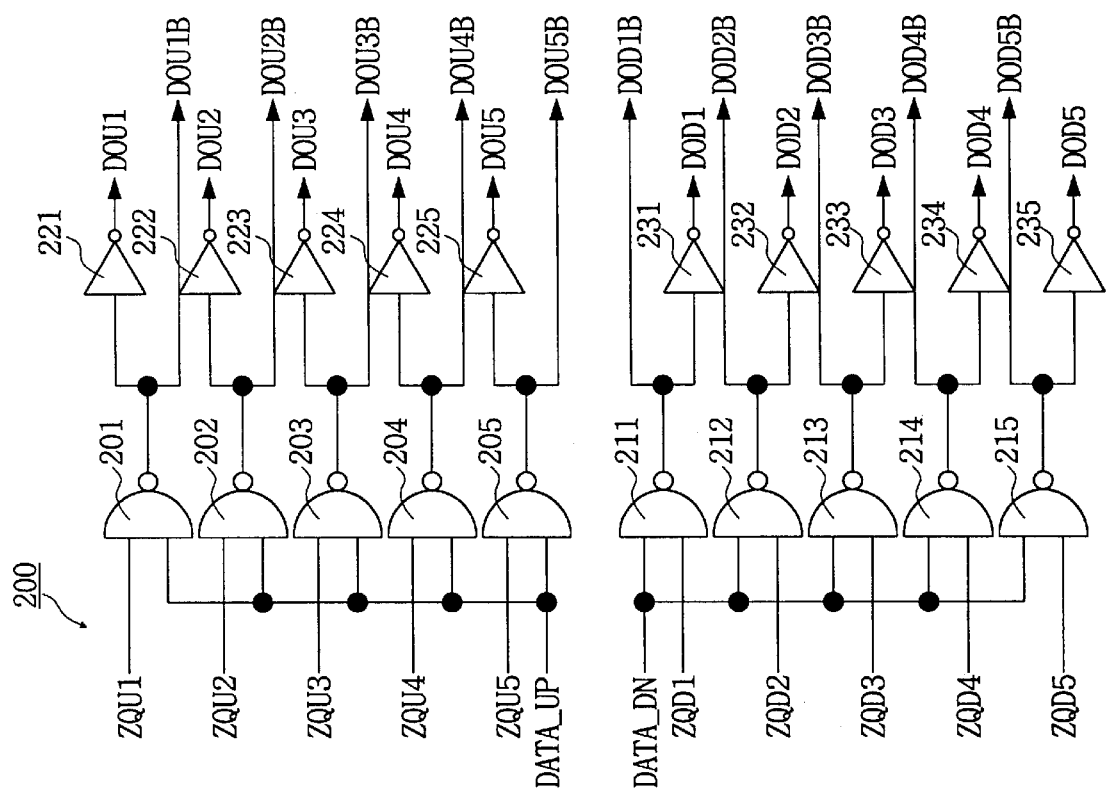
FIG. 4 is a schematic circuit of the multiplexer shown in FIG. 3.

FIG. 4 is a schematic circuit view for illustrating an embodiment of the multiplexer shown in FIG. 3. The multiplexer 200 includes; a first group of NAND gates 201–205 input to generate a NAND response by receiving corresponding codes from the upper driver codes ZQU1–ZQU5 as an input and commonly receiving the data output DATA_UP as the other input; a second group of NAND gates 211–215 to generate a NAND response by receiving corresponding codes from the lower driver codes ZQD1–ZQD5 as an input and commonly receiving the data output DATA_DN as the other input; a first group of inverters 221–225 connected to corresponding outputs of the first group of NAND gates 201–205; and a second group of inverters 231–235 connected to corresponding outputs of the second group of NAND gates 211–215. The multiplexer 200 generates multiplexing outputs DOU1–DOU5, DOU1B–DOU5B, DOD1–DOD5, DOD1B–DOD5B having different logics during data reception, and generates multiplexing outputs DOU1–DOU5, DOU1B–DOU5B, DOD1–DOD5, DOD1B–DOD5B having different logics according to a data of "HIGH" and "LOW" during data transmission reception.

Data outputs DATA_UP, DATA_DN shifted to the multiplexer 200 during data transmission and reception are set up in the following Table 1.

TABLE 1

|  | DATA_UP | DATA_DN |
|---|---|---|
| Transmission |  |  |
| "1" | HIGH | LOW |
| "0" | LOW | HIGH |
| Reception | HIGH | HIGH |

Data transmitting operations of the multiplexer 200 will be described below. In FIG. 4, it is assumed that an input is 5 bits and output also is 5 bits. However, it is possible to increase or decrease the number of bits. For instance, if the upper driver codes ZQU1–ZQU5 is "10000" on the basis of 5 bits during data transmission in which data output "HIGH" is symbolized as "1", only a signal of the multiplexing output DOU1 becomes "HIGH" but signals of the other multiplexing data outputs DOU2–DOU5 become "LOW". And all the multiplexing outputs DOD1–DOD5 output "LOW". The inverting multiplexing outputs DOU1B–DOU5B as shown in FIG. 4 denote inverting signals to the multiplexing outputs DOU1–DOU5, respectively. In addition, the inverting multiplexing outputs DOD1B–DOD5B denote inverting signals to the multiplexing outputs DOD1–DOD5, respectively.

Data receiving operations of the multiplexer 200 will be described below. Since data is not output from inside of an integrated circuit chip at a data reception mode, all the data outputs DATA_UP, DATA_DN become "HIGH". Therefore, the data outputs DATA_UP, DATA_DN are fixed "HIGH" at a data receiving process, so that the upper and lower driver codes ZQU1–ZQU5, ZQD1–ZQD5 are output respectively as upper and lower multiplexing outputs DOU1–DOU5, DOD1–DOD5 without any change in logic. The digital codes of the upper multiplexing outputs DOU1–DOU5 and corresponding digital codes of the lower multiplexing outputs DOD1–DOD5 are not always identical because each upper driver codes ZQU1–ZQU5 and each corresponding lower driver codes ZQU1–ZQU5, ZQD1–ZQD5 provided by the programmable impedance controller 100 are not always identical.

Figure 5:
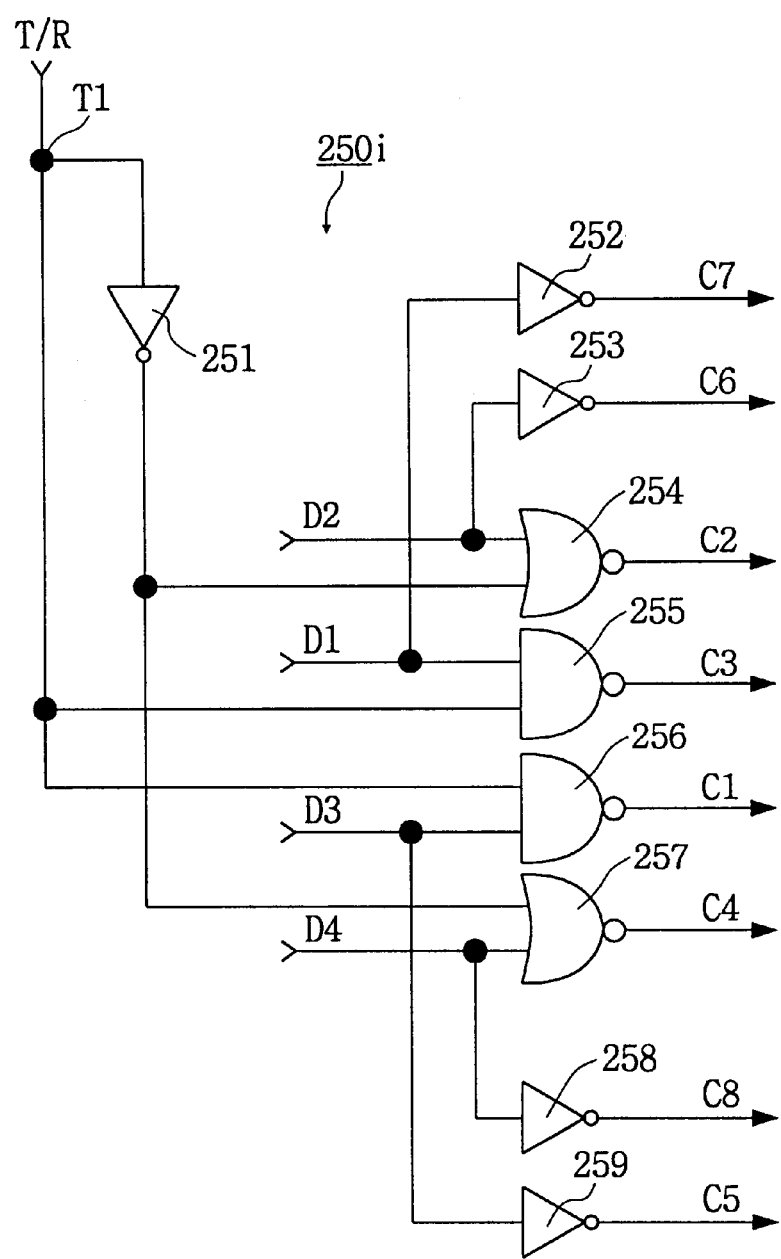
FIG. 5 is a schematic circuit of the control signal generating part shown in FIG. 3.

FIG. 5 is a schematic circuit view for illustrating an embodiment of the plurality of control signal generating parts 250a–250e shown in FIG. 3, which includes a plurality of inverters 251, 252, 253, 258, and 259, NOR gates 254 and 257, and NAND gates 255 and 256. The plurality of control signal generating parts 250a–250e generate control signals C1–C8 to control the plurality of impedance elements (310–340)a, (310–340)b, (310–340)c, (310–340)d, and (310–340)e by receiving a mode signal (T/R) shifted according to a transmission or reception mode and one of the outputs among multiplexing outputs DOU1–DOU5, DOU1B–DOU5B, DOD1–DOD5, DOD1B–DOD5B of the multiplexer 200.

Referring back to FIG. 3, the plurality of input termination circuit cum output drivers 300a–300e are configured with N and P type MOS transistors respectively having a plurality of input impedance elements (310–340)a, (310–340)b, (310–340)c, (310–340)d, and (310–340)e. For example, the input termination circuit cum output driver 300a includes a pull up driver 310a, a pull up driver 330a, a pull down driver 320a, and pull down driver 340a configured in pairs of P and N type MOS transistors. The pairs of transistors used as impedance elements are to secure linearity of operations.

Referring back to FIG. 3, the programmable impedance controller 100 detects a resistance value of a resistor installed at the external part of the integrated circuit chip to correspondingly generate the upper driver codes ZQU1–ZQU5 and lower driver codes ZQD1–ZQD5 as digital codes. The multiplexer 200 multiplexes the digital codes ZQU1–ZQU5, ZQD1–ZQD5 and data outputs DATA_UP and DATA_DN to generate multiplexing outputs DOU1–DOU5, DOU1B–DOU5B, DOD1–DOD5, and DOD1B–DOD5B. When the control signal generating parts 250a–250e receive a mode signal T/R shifted respectively at a transmission or reception mode, any one group of outputs among the multiplexing outputs DOU1–DOU5, DOU1B–DOU5B, DOD1–DOD5, and DOD1B–DOD5B generates control signals C1–C8 to control impedance elements (310–340)a, (310–340)b, (310–340)c, (310–340)d, and (310–340)e. At this time, the mode signal T/R is turned "HIGH" at the transmission mode and turned "LOW" at the reception mode. The control signals C1–C8 are shifted to a plurality of impedance elements (310–340)a, (310–340)b, (310–340)c, (310–340)d, and (310–340)e of the relevant output drivers. Accordingly, each impedance elements (310–340)a, (310–340)b, (310–340)c, (310–340)d, and (310–340)e is selectively turned on or off to match impedances adaptively.

According to a preferred embodiment of the present invention, the output drivers 300a–300e are made with x16, x8, x4, x2, and x1 drivers, respectively, to cover a wide range of the programmable impedance match. Here, the width of transistors configuring x16 drivers 300a is 16 times as great as that of the transistors configuring the x1 drivers 300e. Likewise, the width of transistors configuring x4 drivers 300c is 4 times as great as that of the transistors configuring the x1 drivers 300e.

According to a preferred embodiment of the present invention, the up/down impedance of the each output drivers 300a–300e is divided into two parts to function as an output driver in transmission and as an input termination circuit in reception. As shown in FIG. 2, the up impedance of the x16 driver 300a is the parallel sum of the impedances ZA1 and ZA2, down impedance of the x16 driver 300a is the parallel sum of the impedances ZB1 and ZB2. Each up impedances ZA1 and ZA2 is not always same, and each down impedances ZB1 and ZB2 is not always identical.

Figure 6:
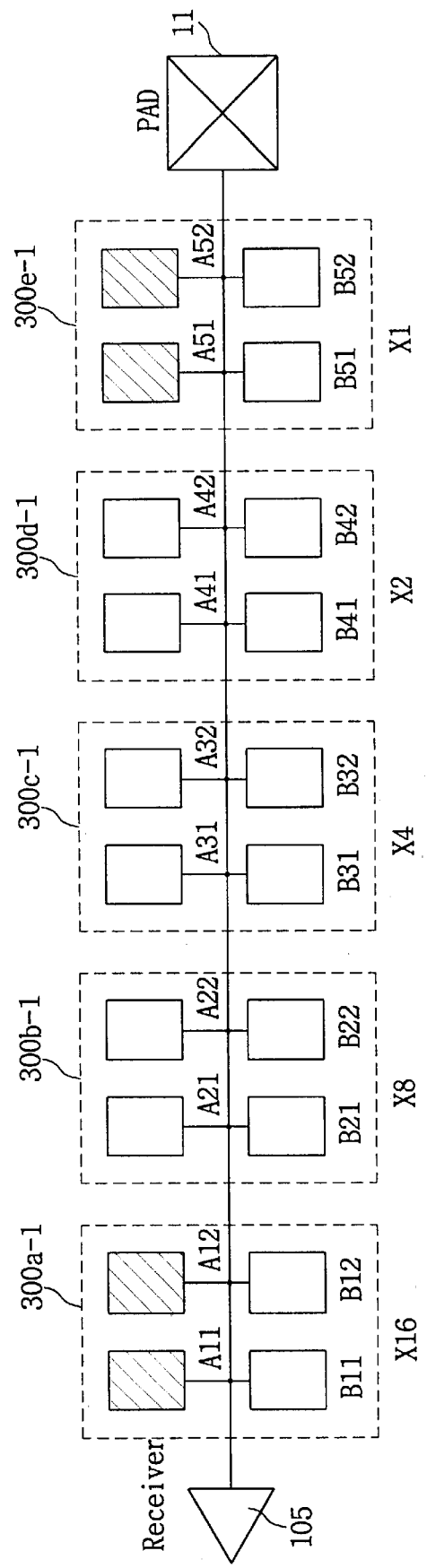
FIGS. 6 through 8 illustrate control methods of impedance elements.
Figure 7:
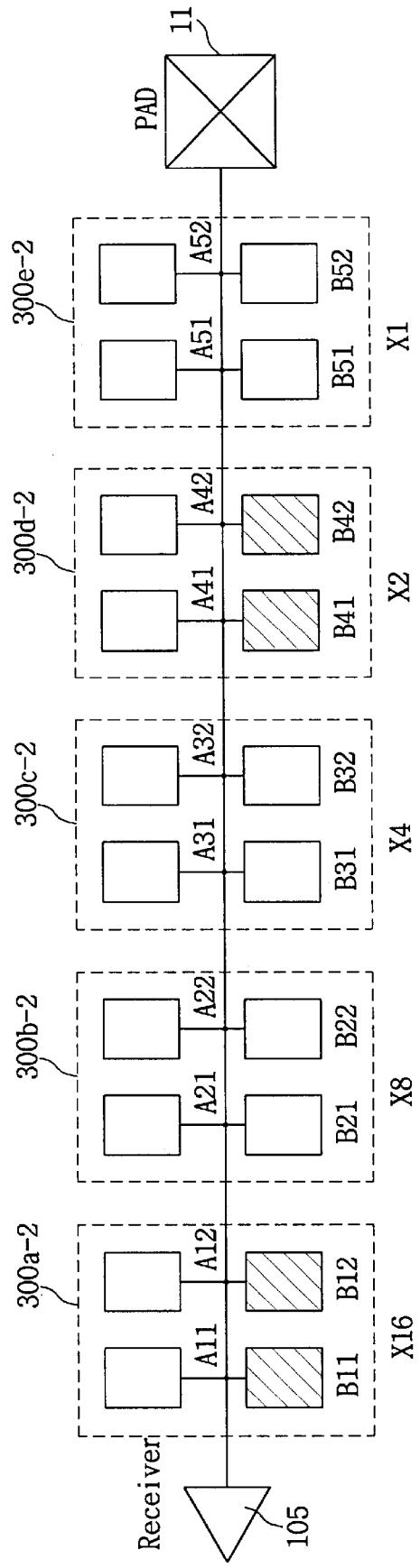
Figure 8:
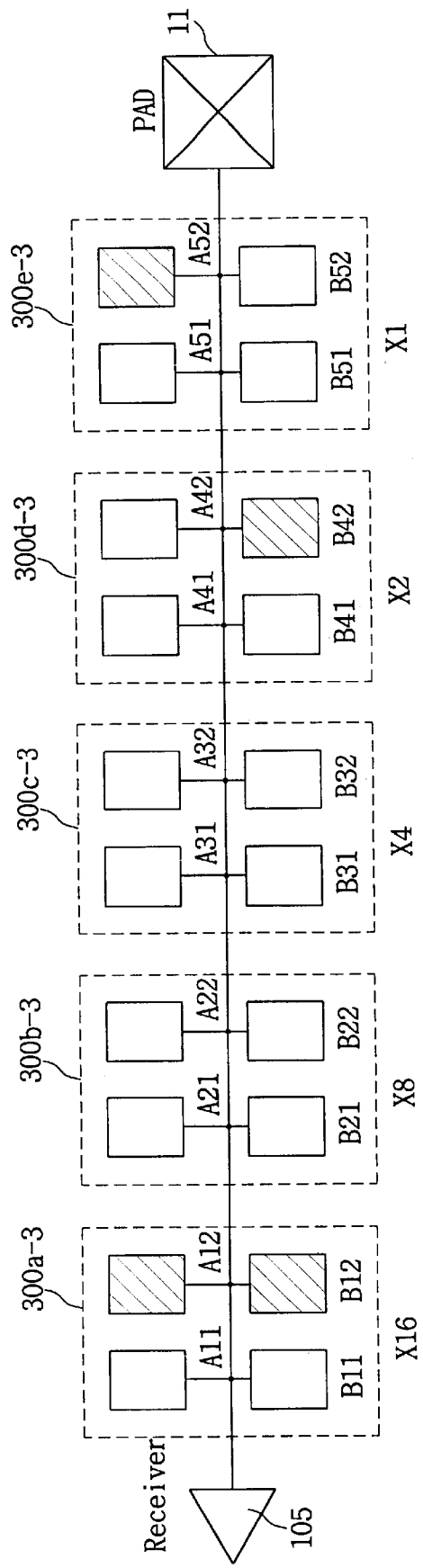

FIGS. 6 through 8 are diagrams for illustrating control methods of impedance elements. The hatched impedance elements of the FIGS. 6 through 8 denote turn-on state transistors.

To make the present invention more thoroughly understood, programmable impedance control operation with 5 bits in transmission will be described. All mode signal T/R is supplied with a logic "HIGH" in transmission.

Referring to FIG. 6, for instance, if a digital code is "10001" in transmission of data "1", only upper drivers of the x16 output driver 300a-1 and the x1 output driver 300e-1 are turned on for matching impedances. In other words, A11 and A12 blocks and A51 and A52 blocks are turned on, and the total impedance is a parallel sum of the two impedances.

Referring to FIG. 7, for instance, if the digital code is "10010" in transmission of data "0", only lower drivers of the x16 output driver 300a-2 and x2 output drivers 300d-2 are turned on for matching impedances. In other words, B11 and B12 blocks of the output driver 300a-2 and B41 and B42 blocks of the output driver 300d-2 are turned on, and the total impedance is a parallel sum of the two impedances.

Likewise, at the data transmission mode, each of the output drivers 300a–300e are programmably matched with characteristic impedance of a transmission line to perform data output driving operations.

Now, a data reception mode will be described as follows. All mode signal T/R is supplied with a signal "LOW" in reception of data. In a data reception mode, impedance elements A*1 and B*1 of x16 through x1 are turned off, impedance elements A*2 and B*2 are turned on. The symbol * denotes any integer number 1 through 5 of the output driver. And each upper/lower drivers operates independently in reception like transmission operation. For instance, if an upper digital code is "10010" in reception, impedance element A12 of the x16 output driver and impedance element A52 of the x1 output driver are turned on. If a lower digital code is "10010", impedance element B12 of x16 output driver and impedance element B42 of x2 output driver are turned on as shown in FIG. 8. That is, upper and lower impedance elements of selected output drivers are independently turned on to match the characteristic impedance with the internal impedance in a transmission line, on-chip termination is to be programmably performed in optimum by the plurality of input termination circuit cum output drivers.

As described above, there are advantages in the programmable impedance control circuit, in which impedance can be programmably set as desired, in that an impedance match can be adaptively performed when characteristic impedance of a transmission line changes in transmission or reception of data, inputting on-chip termination operations may be programmably carried out by a data output circuit without a big increase in capacitance. As a result, power dissipation is decreased at high speed of a semiconductor device and data input and output operations become more reliable and stable to thereby improve performances of a semiconductor memory device.

While the invention has been described in terms of a single preferred embodiment, those skilled in the art will recognize that the invention can be practiced with modification within the spirit and scope of the appended claim.

What is claimed is:

1. A semiconductor device comprising:
   a plurality of termination circuits having a plurality of impedance elements connected to an input/output pad, said termination circuits being controlled by impedance control signals; and
   a controller for detecting changes in characteristic impedance of a transmission line connected to the input/output pad, for setting a digital coding signal in response to the changes in said characteristic impedance of the transmission line, and for outputting said impedance control signals to adaptively control the plurality of impedance elements in the plurality of input termination circuits for matching the impedance to the characteristic impedance of the transmission line,
   wherein the controller comprises: a programmable impedance controller to detect an external resistance value and to generate upper and lower driver codes as digital codes; a multiplexer to multiplex the digital codes as multiplexing outputs; and a plurality of control signal generating parts to receive the multiplexing outputs and a mode signal shifted according to a transmission mode and a reception mode, and to generate the impedance control signals for controlling the plurality of impedance elements.

2. The device claimed in claim 1, wherein each of the plurality of impedance elements is configured in pairs of MOS transistors.

3. The device claimed in claim 1, wherein the multiplexer comprises:
- a first group of NAND gates to generate a NAND response by receiving corresponding digital codes from upper driver codes and commonly receiving upper data outputs;
- a second group of NAND gates to generate a NAND response by receiving corresponding codes from the lower driver codes and commonly receiving lower data outputs;
- a first group of inverters connected to corresponding outputs of the first group of NAND gates: and
- a second group of inverters connected to corresponding outputs of the second group of NAND gates.

4. The device claimed in claim 1, wherein the control signal generating part comprises a plurality of inverters, NOR gates, and NAND gates to generate the impedance control signals to control the plurality of impedance elements by receiving the mode signal, shifted according to the transmission and the reception mode, and one of the multiplexing outputs of the multiplexer.

5. The device claimed in claim 1, wherein the digital coding signal is 5 bits.

6. The device claimed in claim 1, wherein the plurality of termination circuits have different impedance values.

7. The device claimed in claim 1, wherein each of the impedance elements of the plurality of termination circuits is independently controlled.

8. A semiconductor device comprising:
- a plurality of termination circuits connected to a pad to perform programmable on-chip termination operations with a first impedance set at a data reception mode and to adaptively perform programmable output driving operations with a second impedance set at a data output mode; and
- a controller for detecting changes in characteristic impedance of a transmission line, for providing a variable program code signal to the first impedance set when the semiconductor device is in data reception mode, and for providing the variable program code signal to the second impedance set when the semiconductor device is in data output mode, wherein the impedance of the second impedance set is different from that of the first impedance set.

9. A semiconductor memory device to input and output data through a transmission line comprising:
- a termination circuit connected between an input/output pad and an input buffer to adaptively perform a programmable input termination function and a programmable output driving function, and to match impedance with a characteristic impedance of the transmission line in response to programmable code signals, and
- a controller for detecting changes in characteristic impedance of a transmission line, for providing the program code signals to the termination circuit to enable the data output to perform adaptively output driving operations when the semiconductor device is in data output mode, and for providing the program code signals to the termination circuit to enable the data input from outside through the input/output pad when the semiconductor device is in data reception mode.

10. A method for operating the data output circuit of a semiconductor device having a plurality of impedance elements connected to an input/output pad for bi-directional data transmission through a transmission line, the method comprising the steps of:
- providing a variable program code signal to the plurality of impedance elements, when the semiconductor device is in a data output mode, to enable the data output to perform adaptively output driving operations with transmission impedance of the plurality of impedance elements being matched to characteristic impedance of the transmission line; and
- providing the variable program code signal to the plurality of impedance elements, when the semiconductor device is in a data reception mode, to enable the data input from outside through the input/output pad to be shifted to an input buffer connected with the data output circuit with transmission impedance of the plurality of impedance elements being matched to characteristic impedance of the transmission line.

* * * * *